(12) United States Patent
Nakata (10) Patent No.: US 10,263,094 B2
(45) Date of Patent: Apr. 16, 2019

(54) NITRIDE SEMICONDUCTOR DEVICE AND PROCESS OF FORMING THE SAME

(71) Applicant: SUMITOMO ELECTRIC INDUSTRIES, LTD., Osaka (JP)

(72) Inventor: Ken Nakata, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/874,408

(22) Filed: Jan. 18, 2018

(65) Prior Publication Data

US 2018/0204928 A1   Jul. 19, 2018

(30) Foreign Application Priority Data

Jan. 19, 2017   (JP) ................. 2017-007386

(51) Int. Cl.
| | |
|---|---|
| *H01L 21/02* | (2006.01) |
| *H01L 29/66* | (2006.01) |
| *H01L 29/778* | (2006.01) |
| *H01L 29/417* | (2006.01) |
| *H01L 21/24* | (2006.01) |
| *H01L 29/32* | (2006.01) |

(52) U.S. Cl.
CPC .... *H01L 29/66462* (2013.01); *H01L 21/0254* (2013.01); *H01L 21/0262* (2013.01); *H01L 21/02378* (2013.01); *H01L 21/02458* (2013.01); *H01L 21/02505* (2013.01); *H01L 21/246* (2013.01); *H01L 29/32* (2013.01); *H01L 29/41766* (2013.01); *H01L 29/7787* (2013.01); *H01L 21/02499* (2013.01)

(58) Field of Classification Search
CPC .......... H01L 21/02505; H01L 21/0254; H01L 21/02378; H01L 21/0262; H01L 21/02458; H01L 21/246; H01L 21/02499; H01L 29/66462; H01L 29/41766; H01L 29/7787; H01L 29/32

See application file for complete search history.

(56) References Cited

U.S. PATENT DOCUMENTS

2007/0278532 A1*  12/2007  Kosaki ............. H01L 29/66462
                                                                257/214
2011/0092057 A1*  4/2011   Suvorov ............ H01L 21/0465
                                                                438/522

(Continued)

FOREIGN PATENT DOCUMENTS

| | | |
|---|---|---|
| JP | 2003-243424 | 8/2003 |
| JP | 2003-258005 | 9/2003 |

*Primary Examiner* — Kyoung Lee
*Assistant Examiner* — Christina Sylvia
(74) *Attorney, Agent, or Firm* — Smith, Gambrell & Russell, LLP.

(57) ABSTRACT

A process of forming a HEMT that makes the contact resistance of a non-rectifying electrode consistent with other device performance is disclosed. The process includes steps of growing a GaN channel layer with a thickness smaller than 600 nm on a SiC substrate at a growth temperature lower than 1050° C. and growing an AlN spacer layer with a flow rate of $NH_3$ at most 10% smaller than a summed flow rate of $NH_3$ and $H_2$. The grown GaN channel layer includes a substantial density of threading dislocations and the grown AlN layer includes a substantial density of pits.

12 Claims, 7 Drawing Sheets

(56) References Cited

U.S. PATENT DOCUMENTS

| | | | |
|---|---|---|---|
| 2012/0313145 A1* | 12/2012 | Makabe | H01L 21/02378 257/194 |
| 2015/0279942 A1* | 10/2015 | Yui | H01L 29/2003 257/77 |
| 2018/0151349 A1* | 5/2018 | Watanabe | C30B 25/02 |
| 2018/0158926 A1* | 6/2018 | Nakata | H01L 29/66462 |

* cited by examiner

FWHM corresponding to (102) cyrstal plane
of GaN in X-ray lockign curve [arcsec]

NITRIDE SEMICONDUCTOR DEVICE AND PROCESS OF FORMING THE SAME

BACKGROUND OF INVENTION

1. Field of Invention

The present invention relates to a nitride semiconductor device and a process of forming the nitride semiconductor device.

2. Background of Invention

It has been well known in a field that a semiconductor electronic device type of high electron mobility transistor (HEMT) primarily made of nitride semiconductor materials, typically gallium nitride (GaN). A HEMT inherently shows performances in high frequency. Besides, a HEMT made of nitride semiconductor materials shows a high breakdown voltage. Recently, a HEMT with high carrier density, namely, electron density in a channel has also been developed. Japanese Patent Applications laid open No. JP-2003-258005A and JP-2003-243424A have disclosed HEMTs providing an i-type AlGaN layer and an i-type GaN layer forming a hetero-interface therebetween. The hetero-interface between the AlGaN layer and the GaN layer induces a two-Dimensional Electron Gas (2DEG) that inherently shows high-frequency performance.

Another HEMT has been proposed where the hetero-interface between an AlGaN layer and a GaN layer accompanies with an AlN layer, which is often called as a spacer layer, to further enhance the high frequency performance of the HEMT. Because the AlN space layer may isolate carriers in the 2DEG from ions or dopants contained in the AlGaN layer, the HEMT with the spacer layer may enhance the electron mobility in the 2DEG, which may increase saturation current of the channel and accordingly the trans-conductance of the 2DEG. However, the AlN spacer layer, because of greater bandgap energy thereof compared with that of AlGaN, inherently increases contact resistance of electrodes of a source and a drain. The present application proposes a process and a HEMT that makes contact resistance of an electrode against the AlGaN layer consistent with device performance.

SUMMARY OF INVENTION

One aspect of the present invention relates to a process of forming a nitride semiconductor device type of high electron mobility transistor (HEMT). The process includes steps of: epitaxially growing a channel layer made of gallium nitride (GaN) on a substrate made of silicon carbide (SiC), and epitaxially growing a spacer layer made of aluminum nitride (AlN) on the GaN layer. The GaN channel layer is grown by a thickness smaller than 600 nm under a growth temperature lower than 1050° C. The AlN spacer layer is grown under a pressure lower than 50 Torr and a flow rate of ammonia ($NH_3$) that is smaller than 10% of a summed flow rate of $NH_3$ and hydrogen ($H_2$).

Another aspect of the present invention relates to a nitride semiconductor device type of high electron mobility transistor (HEMT). The HEMT includes a channel layer, a spacer layer in the channel layer, a barrier layer on the spacer layer, and an electrode provided on the barrier layer. The channel layer is made of gallium nitride (GaN) with a thickness smaller than 600 nm. The spacer layer is made of aluminum nitride (AlN) with a thickness of 0.8 to 1.2 nm. The electrode has a type of non-rectifying contact. Features of the HEMT of the present invention is that the channel layer shows a full width at half maxima (FWHM) greater than 500 arcsec for (102) plane thereof taken by an X-ray locking curve, the spacer layer has a surface pit density greater than $1.0 \times 10^9/cm^2$, and the electrode has contact resistance against the barrier layer smaller than 0.3 Ω·mm.

DESCRIPTION OF THE DRAWINGS

The invention will now be described by way of examples only with references to the accompanying drawings in which.

DESCRIPTION OF EMBODIMENT

Next, embodiment according to the present invention will be described as referring to accompanying drawings. In the description of the drawings, numerals or symbols same with or similar to each other will refer to elements same with or similar to each other without duplicated explanations.

Figure 1:
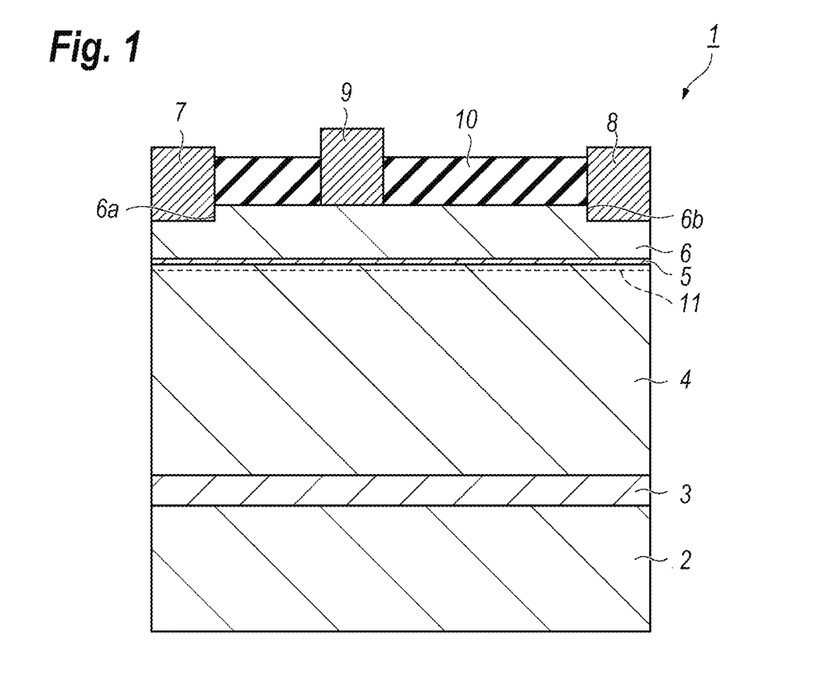
FIG. 1 shows a cross section of a high electron-mobility transistor (HEMT) according to embodiment of the present invention.

FIG. 1 shows a cross section of a nitride semiconductor device type of high electron mobility transistor (HEMT) according to embodiment of the present invention. The HEMT 1, as shown in FIG. 1, provides semiconductor layers, 3 to 6, on a substrate 2 made of silicon carbide (SiC), where the semiconductor layers includes, from a side of the SiC substrate 2, an aluminum nitride (AlN) layer 3, a gallium nitride (GaN) layer 4, another AlN layer 5, and an aluminum gallium nitride (AlGaN) layer 6. The HEMET 1 further includes electrodes of a source 7, a drain 8, and a gate 9, and a passivation film 10 that covers the semiconductor layers between the electrodes, 7 to 9, and the electrodes, 7 to 9.

The SiC substrate 2 has a semi-insulating characteristic. The AlN layer 3 operates not only as a buffer layer but a seed layer for epitaxially growing the semiconductor layers on the SiC substrate 2. The AlN layer 3 preferably has a thickness of 15 to 20 nm. Such a thinned AlN layer 3 is sometimes composed of islands not a continuous layer, where a continuous state means that an epitaxially grown layer is homogeneous along a grown direction.

The GaN layer 4, which is epitaxially grown on the AlN layer 3, may operate as a channel layer. A GaN layer is hard to grow directly on the SiC substrate 2 because of wettability thereof against the SiC substrate 2. Accordingly, the GaN layer 4 is grown interposing the AlN layer 3 against the SiC substrate 2. The GaN layer 4 preferably has a thickness of 300 to 600 nm. A GaN layer with a thickness greater than 300 nm may enhance the crystal quality thereof and resultantly the carrier mobility of the HEMT 1. Also, a GaN layer with a thickness smaller than 600 nm may enable to control the density of defects or dislocations, namely, the density of dislocations, within a preferred range. Threading dislocations derived from lattice defects are induced in the GaN layer 4, where the threading dislocation is defined as a type of linear defect piercing a crystal. Analyzing the GaN layer 4 by the X-ray locking curve, the GaN layer 4 shows a full width at half maximum (FWHM) greater than 500 arcsec for a (102) crystal plane. The specification below described assumes that a FWHM for the (102) plane is the FWHM obtained for the X-ray locking curve. The X-ray locking curve may be measured by rotating only a specimen as fixing the incident angle of the X-ray and the positing of the detector.

The AlN layer 5, which is epitaxially grown on the GaN layer 4, may operate as a spacer layer between the GaN layer 4 and the AlGaN layer 6. The AlN layer 5 is grown thin enough compared with the AlN layer 3 and the GaN layer 4. For instance, the AlN layer 5 of the present embodiment is grown by a thickness of about 1 nm, or preferably from 0.80 to 1.2 nm. The AlN layer 5 inherently shows many pits, or islands isolated from each other. Specifically, the AlN layer 5 shows pit density greater than $1 \times 10^9/cm^2$, preferably greater than $2 \times 10^9/cm^2$. In other words, the AlN layer 5 in the surface thereof shows the roughness in the unit of a root mean square (RMS) greater than 0.2 nm, or preferably greater than 0.5 nm.

The AlGaN layer 6, which is epitaxially grown on the AlN layer 5, may operate as a barrier layer. The GaN layer 4 and the AlGaN layer 6 in an interface therebetween causes stresses due to a difference in lattice constants thereof, where the stresses induces charges by the piezo effect. The AlGaN layer 6 preferably has a thickness of 10 to 30 nm. The AlGaN layer 6 may show the n-type conduction, where electrons derived from donors in the n-type AlGaN layer 6 are superposed on the electrons induced by the piezo effect and those electrons form a channel in the interface therebetween. The AlGaN layer 6 may have aluminum (Al) composition of 25%, which means that the AlGaN layer 6 has the composition of $Al_{0.5}Ga_{0.5}N$. However, the AlGaN layer 6 is not restricted to this composition. For instance, a composition of $Al_{0.2}Ga0.8N$ may be applicable to the AlGaN layer 6. The AlGaN layer 6 has recesses, 6a and 6b, with a depth of ⅓ to ½ of a full thickness of the AlGaN layer 6.

The electrodes of the source 7 and the drain 8 are provided on the AlGaN layer 6. Specifically, the source electrode 7 is in contact with the AlGaN layer 6 within the recess 6a, while, the drain electrode 8 is in contact with the AlGaN layer 6 within the other recess 6b. The source electrode 7 and the drain electrode 8 make non-rectifying contacts against the AlGaN layer 6 and may be formed by alloying stacked metals of titanium (Ti) and aluminum (Al).

The gate electrode 9 is also in contact with the AlGaN layer 6 and provides stacked metals of nickel (Ni) and gold (Au), where nickel (Ni) is in contact with the AlGaN layer 6 and makes a Schottky contact against the AlGaN layer 6. The passivation film 10 may passivate the AlGaN layer 6 and cover the AlGaN layer 6 between the electrodes, 7 to 9. The passivation film 10 may be made of silicon nitride (SiN).

The HEMT 1 thus configured forms two-dimensional electron gas (2DEG) in the GaN layer 4 at the interface against the AlN layer 5, where the 2DEG forms the channel 11 for the HEMT 1.

Next, a process of forming the HEMT 1 according to embodiment of the present invention referring to accompanying drawings, FIG. 2A to FIG. 2C FIG. 3A, and FIG. 3B, where those figures show cross sections of the HEMT 1 at respective steps of the process.

Figure 2A:
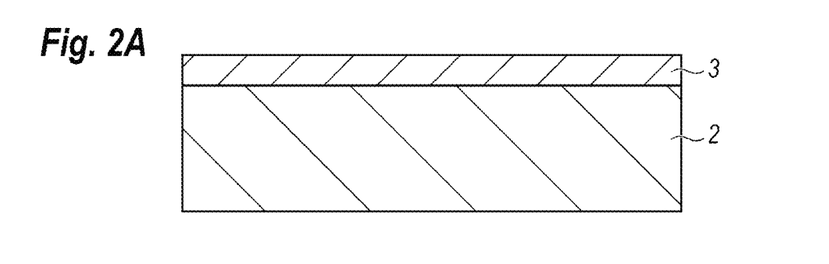
FIG. 2A to FIG. 2C show cross sections of the HEMT shown in FIG. 1 at respective steps of the process thereof.

First, an aluminum nitride (AlN) layer 3 is epitaxially grown on a substrate 2 made of silicon carbide (SiC) by the metal-organic chemical vapor deposition (MOCVD) technique. The grown AlN layer 3 may have a thickness of around 20 nm. Also, the MOCVD technique uses tri-methyl-aluminum (TMA) and ammonia ($NH_3$) for sources of a group III element, namely aluminum (Al), and a group V element, namely nitrogen (N), respectively. Hydrogen ($H_2$) is used as a carrier gas in the MOCVD growth. Growth conditions of the AlN layer 3 are, a temperature of 1100° C. and a pressure of 100 Torr, namely 133 kPa, where the growth temperature is that of a susceptor on which the substrate 2 is placed and the growth pressure is that within a growth chamber of the MOCVD apparatus.

Figure 2B:
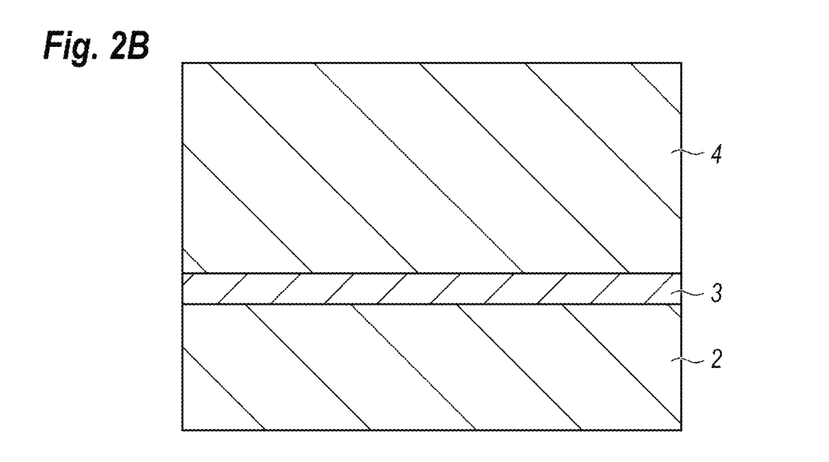

Thereafter, a gallium nitride layer 4 is grown on the AlN layer 3 by a thickness of, for instance 500 nm, which is relatively thinner compared with a conventional HEMT having a GaN channel layer, by the MOCVD process using tri-methyl-gallium (TMG) as a source for the group III element, namely gallium (Ga), and the ammonia ($NH_3$) for group V element, namely nitrogen (N). Hydrogen ($H_2$) is also used as the carrier gas. Growth conditions of the GaN layer 4 is a temperature higher than 1000° C. but lower than 1100° C., where the present embodiment sets the growth temperature to be 1050° C. The lower condition of the growth temperature may be determined by crystal quality of grown GaN layer, while, the higher condition may be determined by a condition that the FWHM for (102) plane of a GaN in the X-ray locking curve becomes greater than 500 arcsec. The growth pressure for the GaN layer 4 may be same with that for the AlN layer 3, namely around 100 Torr.

Figure 2C:
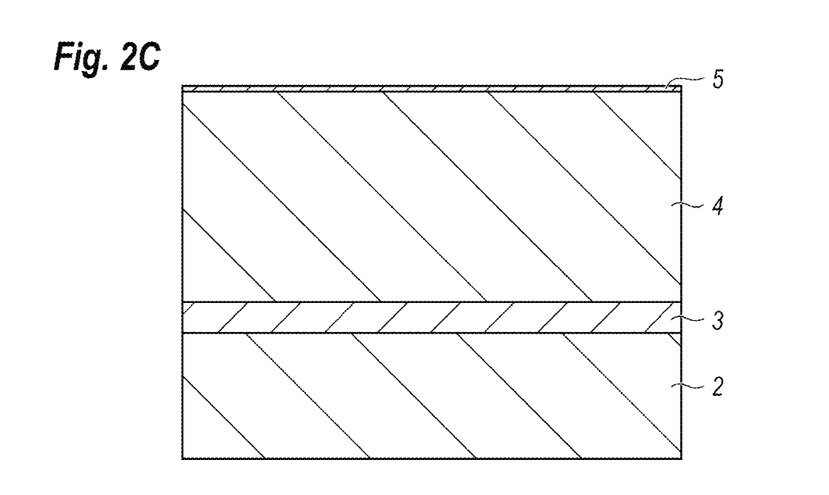

Thereafter, another aluminum nitride (AlN) layer 5 is grown on the GaN layer 4 by the MOCVD technique by a thickness of about 1 nm, specifically, thicker than 0.8 nm but thinner than 1.2 nm. The MOCVD technique uses TMA and $NH_3$, same with those for the former AlN layer 3, and hydrogen ($H_2$) as the carrier gas. In the growth of the AlN layer 5, the TMA in a flow rate thereof is far smaller than that of the $NH_3$ and $H_2$ of the carrier gas. That is, the flow rate of TMG is substantially ignorable compared with $NH_3$ and $H_2$. Specifically, the flow rates of $NH_3$ and $H_2$ are from a few thousands to a few scores of thousands times greater than that of TMA. Accordingly, a total flow rate of source gases may be substantially determined by ammonia ($NH_3$) and hydrogen ($H_2$). In the present embodiment, the growth of the AlN layer 5 may be carried out under a ratio in the flow rate of ammonia ($NH_3$) less than 10% of the summed flow rate of ammonia ($NH_3$) and hydrogen ($H_2$). Other growth conditions for the AlN layer 5 are the growth temperature lower than 1050° C., specifically, 1000° C. in the present embodiment, and the growth pressure smaller than 50 Torr (67 kPa).

Figure 3A:
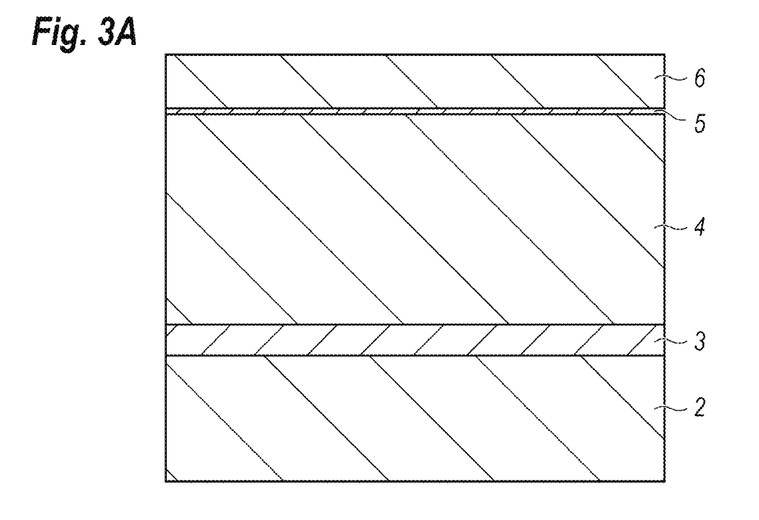
FIG. 3A and FIG. 3B show cross sections of the HEMT at respective steps subsequent to the step shown in FIG. 2C.

Then, as shown in FIG. 3A, the AlGaN layer 6 is grown on the AlN layer 5 also by the MOCVD technique. The AlGaN layer 6 has an aluminum composition of 25%, namely $Al_{0.5}Ga_{0.5}N$, and a thickness of 20 nm. The MOCVD uses TMA, TMG, and $NH_3$ for sources of aluminum (Al), gallium (Ga), and nitrogen (N), respectively; and $H_2$ as the carrier gas. The flow rates of TMA and TMG are set far smaller than those of $NH_3$ and $H_2$. In step of growing the AlN layer 5, the flow rates of $NH_3$ and $H_2$ satisfy the condition of:

$$[NH_3]/([NH_3]+[H_2])<10\%,$$

where [NH₃] and [H₂] denote the flow rates of NH₃ and H₂, respectively. While, the growth conditions, namely, a growth temperature and a growth pressure, for the AlGaN layer 6 are substantially same with those for the AlN layer 5. The AlGaN layer 6 may induce the 2DEG in the interface, exactly, in the GaN layer 4 at the interface against the AlGaN layer 6, which forms the channel 11.

Figure 3B:
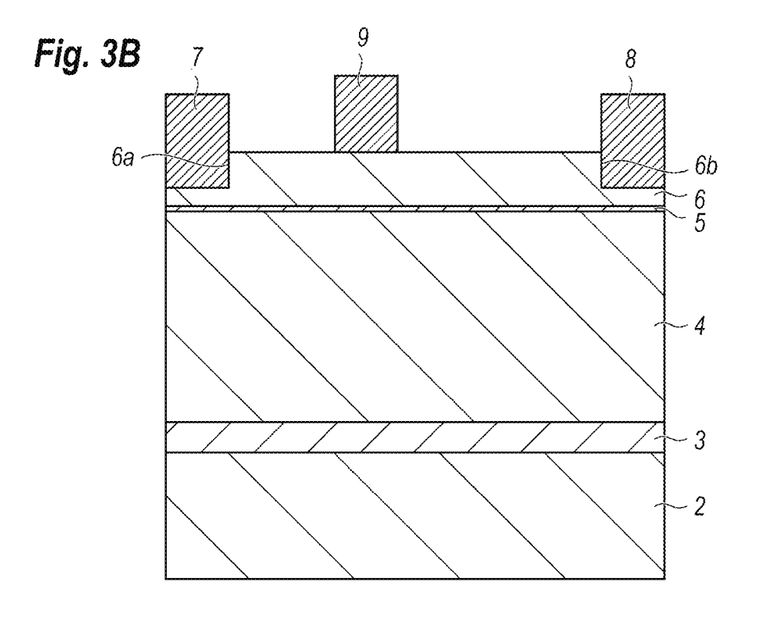

Thereafter, electrodes of the source 7, the drain 8, and the gate 9 are formed on the AlGaN layer 6 by sequential processes of photolithography, metal deposition, and metal lift-off. Specifically, two recesses, 6a and 6b, are formed in regions, where the source electrode 7 and the drain electrode 8 are to be formed, by etching the AlGaN layer 6. Depositing stacked metals of titanium (Ti) and aluminum (Al) in the present embodiment, and subsequently alloying the stacked metals at a temperature of 700° C. for one minutes, non-rectifying contacts may be formed within the recesses, 6a and 6b. Then, the gate electrode 9, which may be another stacked metals of nickel (Ni) and gold (Au) are formed on the AlGaN layer 6. Finally, the electrodes of the source 7, the drain 8, and the gate 9, and the AlGaN layer 6 exposed between the electrodes, 7 to 9, may be covered with a passivation film 10. Thus, the process of forming the HEMT 1 in primary steps thereof may be completed.

Mechanisms for reducing the contact resistance of the non-rectifying contacts against the AlGaN layer 6 will be described.

Figure 4:
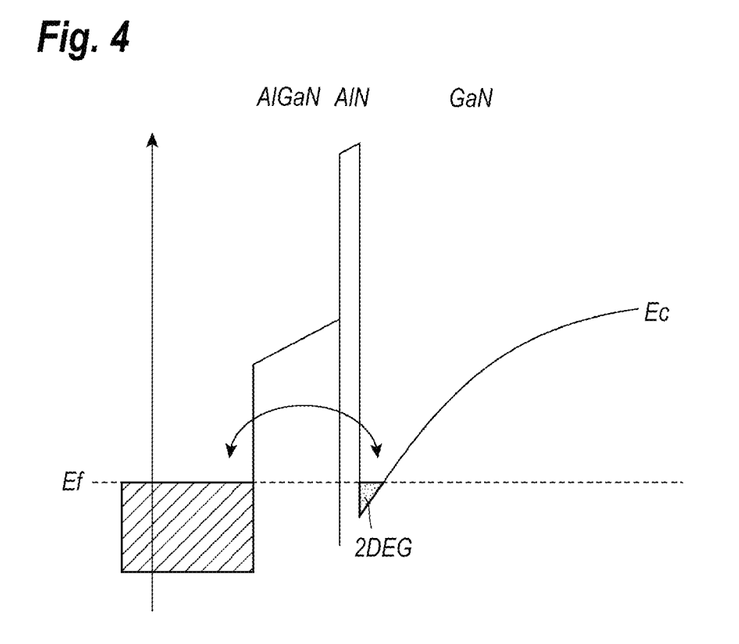
FIG. 4 schematically illustrates a diagram of the conduction band in the HEMT shown in FIG. 1.

When the AlN layer 5 is put between the GaN layer 4 and the AlGaN layer 6 as shown in FIG. 1, the piezo effect causes negative carriers in the interface between the AlN layer 5 and the AlGaN layer 6. Besides, the spontaneous polarization between two layers 5 and 6 causes the carries in the interface therebetween. However, the electron affinity of the AlN layer 6 is higher enough, which raises the diagram of the conduction band thereof as shown in FIG. 4 and forms a barrier for carrier transportation between the 2DEG and the non-rectifying contact. Thus, the contact resistance of the electrodes and also access resistance from the electrodes to the 2DEG increase.

Conventionally, an additional semiconductor layer that is heavily doped with n-type dopants is interposed between the AlGaN layer 6 and the electrodes of the source 7 and the drain 8; or a recess reaching the GaN layer 4 but filled with a material showing non-rectifying contact may be utilized for reducing the contact resistance and the access resistance. The former technique to form the heavily doped layer inevitably requires processes of forming a protection film with excellent quality, implanting ions as n-type dopants, activating implanted ions, and removing the protection film degraded by the ion-implantation. Thus, the process becomes complicated and takes time. Besides, the activation of the implanted ions is necessary to raise a temperature exceeding 1000° C., which degrades quality of nitride semiconductor materials, and accordingly the reliability of the HEMT. The latter process of forming the recess and filling the recess with the material showing non-rectifying contact makes a distance from the electrode to the channel short enough to reduce the access resistance. However, this process inevitably requires for precisely controlling a depth of the recess. Even a dry process, typically the reactive ion-etching (RIE), used for forming the recess is substantially hard to precisely control the depth of the recess. Thus, even the second technique for forming the recess is hard to realize contact resistance that is uniform within a wafer and stable between wafers.

Figure 5:
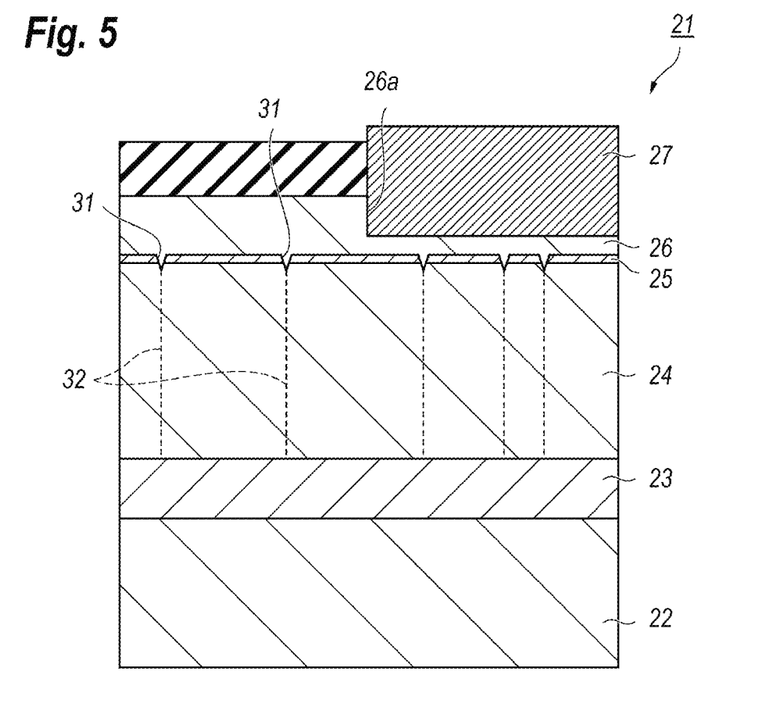
FIG. 5 shows a cross section magnifying a portion between the electrode and the channel in a HEMT.

FIG. 5 shows a cross section magnifying a portion between the electrode and the channel in a_HEMT 21. The AlGaN layer 26 shown in FIG. 5 provides a recess 26a within which the electrode 27 is filled. The AlN layer 25 has a thickness of about 1 nm, while, the AlGaN layer 26 has a thickness of 20 nm. The electrode 27 is formed by alloying stacked metals of titanium (Ti) with a thickness of 20 nm and aluminum (Al) with a thickness of 200 nm, where titanium is in contact with the AlGaN layer 26. The alloy of the stacked metals is carried out at 700° C. for 1 minute. Thus, the non-rectifying contact against the AlGaN layer 26 may be obtained.

One of reasons why the contact resistance of the electrode 27 against the AlGaN layer 26 is scattered or becomes unstable is seemed to depend on the AlN layer 25 put between the AlGaN layer 26 and the GaN layer 24. That is, when the AlN layer 25 in the cross section and the surface thereof shows a lot of pits 31 each showing a V-shape, the electrode 27 shows relatively smaller contact resistance against the AlGaN layer 26. This is because polarization opposite to that caused by the piezo effect may be weakened in regions in the AlN layer 25 where the pits 31 are induced, which may lower a level Ec of the conduction band against the Fermi level Ef; that is, a difference $E_C$-$E_F$ becomes smaller and accordingly the non-rectifying contact may be facilitated.

However, the pits 31 in the AlN layer 25 are hard to reduce the contact resistance, that is, a condition for inducing a lot of pits 31 in the AlN layer 25 alone was found to be hard to reduce the contact resistance of electrode 27 against the AlGaN layer 26. That is, it was found that interaction between threading dislocations 32 induced in the GaN layer 24 and the pits in the AlN layer 25 may effectively reduce the contact resistance of the electrode 27. Even the growth condition for the AlN layer 25 so as to induce a lot of pits therein is set during the process, the contact resistance is hard to be stably lowered when the GaN layer 24 shows smaller density of the threading dislocation, because the lesser density of the threading dislocations in the GaN layer 24 results in the lesser density of the pits in the AlN layer 25. Accordingly, in order to reduce the contact resistance of the electrode 27, the growth condition for the GaN layer 24 is first requested to increase the density of the threading dislocations therein. Besides, the growth condition for the AlN layer is next requested to increase the pit density therein. Thus, the access resistance from the electrode 27 to the channel may be stably and continuously reduced.

The growth conditions for the GaN layer 24 are first investigated. A GaN layer containing the threading dislocations with density greater than a preset condition may be evaluated through the FWHM for (102) plane in the X ray locking curve. That is, it is found that the FWHM greater than 500 arcsec corresponds to the density of the threading dislocations greater than the preset condition. The FWHM strongly depends on a growth temperature, that is, as lowering the growth temperature, the grown layer degrades the quality thereof such that the FWHM becomes greater than 500 arcsec. However, because the GaN layer 24 operates as the channel layer, poor crystal quality thereof also degrades the performance of the HEMT.

An optimum condition between the density of the threading dislocation and the performance of the channel layer may be realized by adjusting a thickness and a growth temperature of the GaN layer 24. Thus, an adjustment between the growth temperature and the thickness of the GaN layer may form a GaN layer operable as the channel layer with the density of the threading dislocation greater than the preset condition. A thicker GaN layer generally shows the smaller density of the threading dislocation, which makes the FWHM for (102) plane small. When the GaN layer 24 is grown on the SiC substrate 22, such a GaN layer 24 is likely to show a relatively small FWHM for (102) plane because a GaN has a lattice constant closer to that of the SiC substrate. For instance, even a GaN layer 24 with a thickness of about 500 nm, which is relatively thin compared with channel layers in conventionally known HEMTs, the grown GaN layer 24 shows the FWHM for (102) plane narrower than 300 arcsec by raising the growth temperature to 1060° C., which is only 10° C. higher than a temperature conventionally adopted, and shows the density of the treading dislocations smaller than the preset condition.

Accordingly, in order to grow the GaN layer 24 showing the FWHM for (102) plane greater than 500 arcsec, the GaN layer 24 is required to have a thickness smaller than 600 nm and to be grown at a temperature lower than 1050° C. Providing the growth temperature for the GaN layer 24 is set to be 1020° C., the FWHM for (102) plane becomes around 350 arcsec for a thickness of the GaN layer 24 with about 1000 nm, which is still insufficient for reducing the contact resistance of the electrode 27. On the other hand, the growth temperature lower than 1000° C. results in a degraded surface of the grown GaN layer 24. That is, the grown GaN layer may not show a mirror surface. Thus, the GaN layer 24 grown on the SiC substrate 22 may make the quality thereof competent for a HEMT consistent with the density of the threading dislocation greater than a preset condition by controlling the growth temperature and the thickness thereof.

Figure 6:
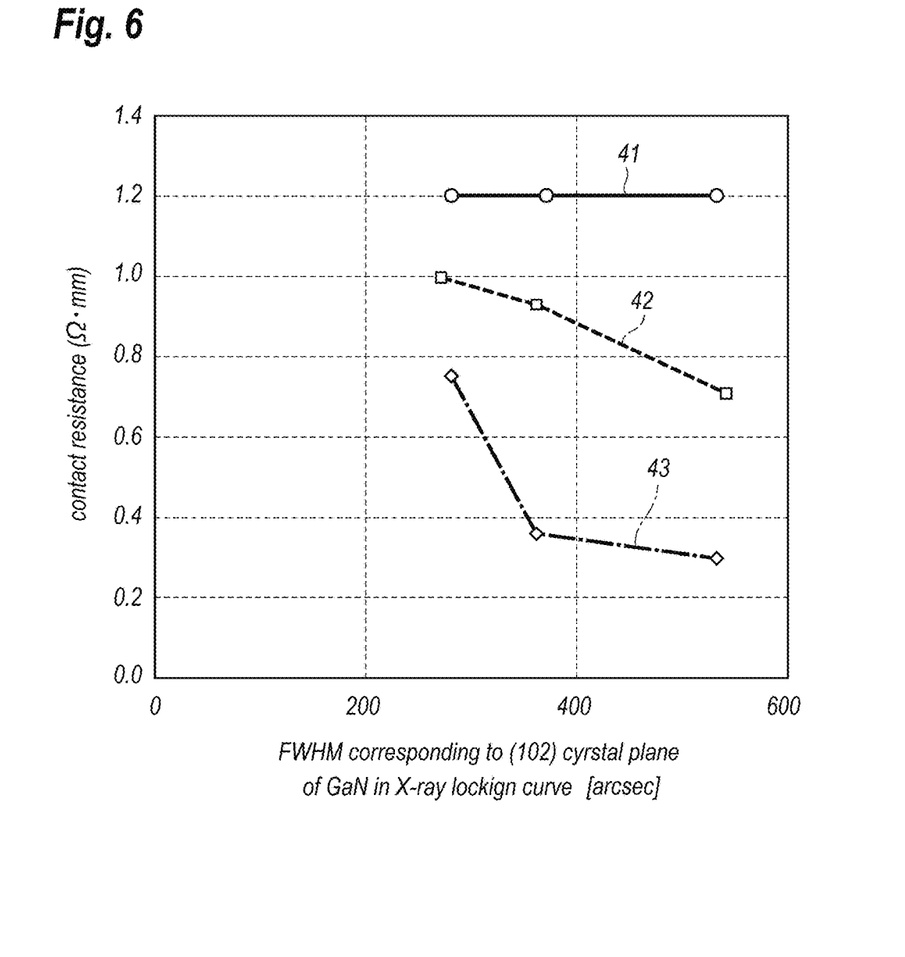
FIG. 6 shows behaviors of contact resistance of an electrode formed on a barrier layer against the FWHM for (102) plane of GaN when AlN layers are grown on the GaN layer under various conditions.

Next, conditions for the AlN layer 25 were investigated. FIG. 6 shows behaviors, 41 to 43, of the contact resistance against the FWHM for (102) plane for AlN layers grown on the GaN layer under various conditions, where source gases of TMA for aluminum (Al), $NH_3$ for nitrogen (N) and $H_2$ as a carrier gas were commonly used. The AlN layer 25 corresponding to the behavior 41 was grown under a condition where ammonia ($NH_3$) is supplied with relatively larger flow rate; specifically, the growth pressure of 100 Torr and a ratio of the flow rate of $NH_3$ against the flow rates of the whole sources to be 30%. As described, the flow rate of TMA is far smaller than those of $NH_3$ and $H_2$, accordingly, the whole flow rates above described is substantially equal to those of $NH_3$ and $H_2$. The contact resistance of the electrode 27 become about 1.2 Ω·mm independent of the density of the threading dislocation.

The behavior 42 corresponds to a condition where the Al layer 25 was grown at a relatively lower growth pressure and a relative greater flow rate for $NH_3$. Specifically, the growth pressure was set to be 50 Torr (about 67 kPa) and the ratio of the flow rate of $NH_3$ against the flow rate of the whole sources to be 30%. As shown in FIG. 6, the behavior 42 gradually decreases the contact resistance of the electrode 27 as the FWHM for (102) plane for GaN, namely, the density of the threading dislocation increases, but the contact resistance did not become stable in a lower resistance.

The behavior 43 corresponds to a condition where the ratio of the flow rate of $NH_3$ against the flow rate of the whole sources was relatively smaller, specifically, the condition of the growth pressure of 50 Torr (67 kPa) and the ratio of the flow rate of $NH_3$ against the flow rate of the whole sources to be 10%. When the GaN layer 24 beneath the grown AlN layer 25 shows the FWHM for (102) plane greater than 400 arcsec; that is, the GaN layer 24 has the density of the threading dislocation greater than a preset condition, the contact resistance of the electrode 27 showed relatively lower resistance and become stable at such lower resistance. Thus, the GaN layer 24 with the FWHM for (102) plane greater than 500 arcsec and the AlN layer 25 provided on the GaN layer 24 grown under a relatively a smaller flow rate of $NH_3$, the electrode 27 shows relative smaller contact resistance.

A HEMT 1 according to the present invention may provide a semiconductor stack that includes a GaN layer 4 grown on the SiC substrate 2 as a channel layer, an AlN layer 5 grown on the GaN layer 4 as a spacer layer, and an AlGaN layer 6 grown on the AlN layer 5 as a barrier layer, where the GaN layer 4 is grown under conditions of a temperature lower than 1050° C. and by a 600 nm at most, the AlN layer is grown under conditions of a growth pressure lower than 50 Torr and a ratio of the flow rate of $NH_3$ against a total flow rate of source to be 30%. The GaN layer 4 grown under such conditions shows the FWHM for (102) plane smaller than 500 arcsec, which corresponds to the density of the threading dislocation greater than a preset density; and the AlN layer 5 grown on the GaN layer 4 shows a lot of the pits greater than a predetermined density; and the electrodes, 7 and 8, stably shows the contact resistance lower than a preset resistivity, which enhances high frequency performance of the HEMT 1.

Besides, the HEMT 1 of the present embodiment further provides a AlGaN layer 6, which is operable as the barrier layer, or the carrier supplying layer, grown under conditions of the growth pressure lower than 50 Torr and the ratio of the flow rate of $NH_3$ against the total flow rate including those for $NH_3$ and $H_2$ that is smaller than 10%, where the AlGaN layer preferably has a thickness smaller than 30 nm, where the present embodiment has the thickness of the AlGaN layer 6 of 20 nm. The AlN spacer layer 5 between the GaN channel layer 4 and the AlGaN barrier layer 6 is preferably about 1 nm.

The process of forming the HEMT 1 of the present invention is not restricted to the embodiment thus described above. For instance, the barrier layer 6 of the present embodiment is made of AlGaN, but, the HEMT 1 may provide the barrier layer made of, for instance, indium aluminum gallium nitride (InAlGaN), indium aluminum nitride (InAlN), and so on. Also, the HEMT 1 of the present embodiment may further provide a cap layer on the AlGaN layer 6. The cap layer may be made of GNU with a thickness of around 3 nm, specifically, 2.5 to 3.5 nm, or may show an n-type conduction.

Also, the HEMT 1 of the embodiment may provide a hetero-structure for the GaN channel layer 4. That is, the channel layer may provide an arrangement of a stacked layer of GaN/AlGaN, where GaN layer is in contact with the AlN layer 4 and a thickness of about 20 nm. In that arrangement, the AlGaN layer under the thinned GaN layer becomes dominant for the crystal quality; that is, the AlGaN layer under the thinned GaN layer may have the FWHM for (102) plane greater than 500 arcsec. Even for such a stacked channel layer, the spirit of the present invention may be applied.

The following summarizes the process of forming a HEMT according to the present invention.

Figure 7A:
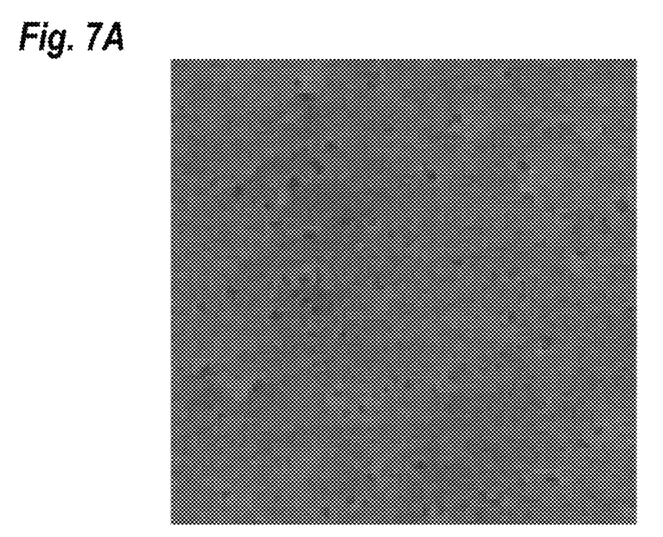
FIG. 7A and FIG. 7B are compared in surfaces of the AlN layer grown under the conditions of the present invention with those of conventional conditions, respectively.

First, an epitaxial substrate is prepared by sequentially growing, on the SiC substrate, the AlN buffer layer with a thickness of 20 nm, the GaN channel layer with a thickness of 500 nm, the AlN spacer layer with a thickness of 1 nm and an aluminum (Al) composition of 25%, and the AlGaN barrier layer with a thickness of 20 nm. Then, the electrodes of the source and the drain, which are the type of non-rectifying contact, are formed by allowing the stacked metal of titanium (Ti) and aluminum (Al) on the AlGaN barrier layer after slightly etching the AlGaN barrier layer; and the gate electrode with the stacked metal of Ni/Au on the AlGaN barrier layer, where Ni forms the Schottky contact against the AlGaN barrier layer. Finally, the HEMT 1 is covered with the passivation film made of silicon nitride (SiN). The growth temperatures for the AlN buffer layer, the GaN channel layer, the AlN spacer layer, and the AlGaN barrier layer are 1100° C., 1040° C., 1000° C., and 1000° C., respectively; while, the growth pressures for the AlN spacer layer and the AlGaN barrier layer are both 50 Torr. Also, the flow rate of NH3 for the AlN spacer layer is 10% of the flow rates of the whole source materials. The HEMET 1 thus formed shows the contact resistance of 0.3 Ω·mm for the electrodes of the source and the drain, and the FWHM for (102) plane of the GaN channel layer of 530 arcsec. FIG. 7A is a photograph of the surface of the AlN spacer layer taken by an atomic force microscope (AFM). The surface shows the average roughness of 0.51 nm in the unit of the root mean square (RMS) and the pit density of $2\times10^9/cm^2$. The pits have V-shaped valleys.

Figure 7B:
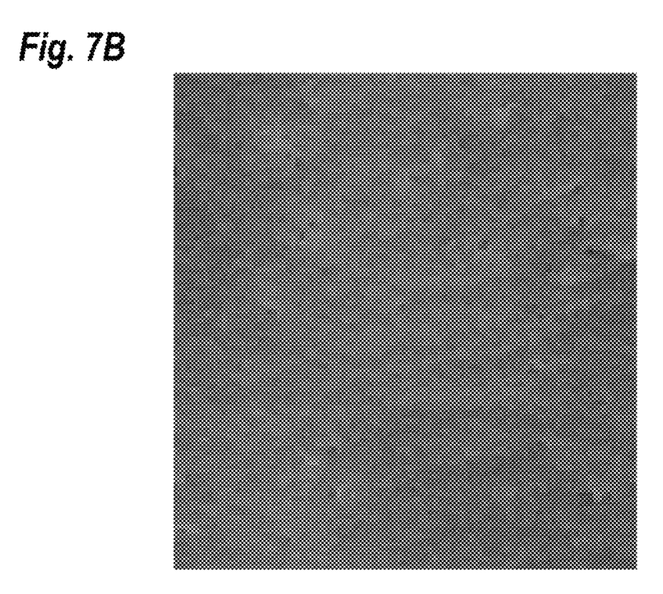

On the other hand, another HEMT that is comparable to the HEMT 1 of the embodiment was prepared for comparing performance with the present HEMT. The comparable HEMT provided the GaN channel layer that was grown at a temperature of 1080° C., which was higher than the temperature of the embodiment by 40° C., and a thickness of 1200 nm, which was almost twice of that of the HEMT 1. Besides, the AlN spacer layer was grown at a pressure of 150 Torr, which was higher than the pressure of the invention, and the flow rate for $NH_3$ of 30% against the total flow rate of the whole source gases. The comparable HEMT showed the contact resistance of the source and drain electrodes of 1.2 Ω·mm and the FWHM for (102) plane of the GaN channel layer of 280 arcsec. The pit density of the AlN layer was $1\times10^8/cm^2$. FIG. 7B shows an AFM photograph of the surface of the AlN layer of the comparable HEMT, where the surface of the AlN layer showed the surface roughness, in the unit of root mean square (RMS), of 0.13 nm.

Another HEMT was compared with the HEMT of the present invention. Another HEMT was prepared by the process same with the process above described for the GaN channel layer but other layers are grown by the conditions of the present invention. That is, the AlN layer was grown under the condition of the present invention, under which the AlN layer is likely to cause a lot of pits, while, the GaN channel layer was grown by the condition that was hard to increase the FWHM for (102) plane thereof. The another HEMT showed the contact resistance of 1.0 Ω·cm and the FWHM for (102) plane of the GaN channel layer of 270 arcsec. The AlN surface of another HEMT showed the surface roughness, in the unit of RMS, of 0.27 nm that was greater than that observed in the aforementioned example of the comparable HEMT, but considerably smaller than the roughness shown in the HEMT of the invention. Thus, only the AlN layer grown under the conditions to cause a lot of pits in the surface thereon, where the GaN layer under the AlN layer is grown under the condition to enhance the crystal quality thereof, is hard to lower the contact resistance of the electrode against the AlGaN barrier layer on the AlN layer.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2016-007386, filed on Jan. 16, 2017, which is incorporated herein by reference.

I claim:

1. A process of forming a nitride semiconductor device type of high electron mobility transistor (HEMT), comprising steps of:
    epitaxially growing a channel layer made of gallium nitride (GaN) on a substrate made of silicon carbide (SiC) to have a thickness smaller than 600 nm at a growth temperature lower than 1050° C.; and
    epitaxially growing a spacer layer made of aluminum nitride (AlN) on the GaN layer at a pressure lower than 50 Torr and a flow rate of ammonia ($NH_3$) that is smaller than 10% of a summed flow rate of $NH_3$ and hydrogen ($H_2$).

2. The process according to claim 1,
    further including a step of growing an aluminum gallium nitride (AlGaN) layer on the AlN layer at a growth pressure lower than 50 Torr and a ratio of the flow rate of $NH_3$ that is smaller than 10% of the summed flow rate of $NH_3$ and $H_2$.

3. The process according to claim 2,
    wherein the step of growing the AlGaN layer grows the AlGaN layer with a thickness of 15 to 20 nm.

4. The process according to claim 2,
    wherein step of growing the AlGaN layer grows an $Al_{0.2}Ga_{0.8}N$ layer.

5. The process according to claim 2,
    further including a step of growing another gallium nitride (GaN) layer on the AlGaN layer with a thickness of 2.5 to 3.5 nm.

6. The process according to claim 1,
    wherein the step of growing the AlN layer grows the AlN layer with a thickness of 0.8 to 1.2 nm.

7. The process according to claim 1,
    wherein the step of growing the GaN layer grows the GaN layer to have a thickness of 500 nm.

8. A nitride semiconductor device type of high electron mobility transistor (HEMT), comprising:
    a channel layer made of gallium nitride (GaN), the channel layer having a thickness smaller than 600 nm;
    a spacer layer made of aluminum nitride (AlN) provided on the channel layer, the spacer layer having a thickness of 0.8 to 1.2 nm;
    a barrier layer provided on the spacer layer; and
    an electrode provided on the barrier layer, the electrode having a type of non-rectifying contact;
    wherein the channel layer shows a full width at half maxima (FWHM) greater than 500 arcsec for a (102) plane thereof taken by an X-ray locking curve,
    wherein the spacer layer has a surface pit density greater than $1.0\times10^9/cm^2$, and
    wherein the electrode has contact resistance against the barrier layer smaller than 0.3 Ω·mm.

9. The nitride semiconductor device according to claim 8,
    wherein the spacer layer has surface roughness greater than 0.2 nm in a unit of root mean square (RMS).

10. The nitride semiconductor device according to claim 8,
    further including a substrate made of silicon carbide (SiC) and a buffer layer made of aluminum nitride (AlN),
    wherein the channel layer, the spacer layer, and the barrier layer are provided on the buffer layer.

11. The nitride semiconductor device according to claim 8, further including a cap layer provided on the barrier layer, the cap layer being made of gallium nitride.

12. The nitride semiconductor device according to claim 8, wherein the barrier layer is made of one of aluminum gallium nitride (AlGaN), indium aluminum gallium nitride (InAlGaN), and indium aluminum nitride (InAlN).

* * * * *